(12) United States Patent
Docquier et al.

(10) Patent No.: US 10,547,326 B2
(45) Date of Patent: Jan. 28, 2020

(54) ERROR CORRECTION IN A FLASH MEMORY

(71) Applicant: PROTON WORLD INTERNATIONAL N.V., Diegem (BE)

(72) Inventors: Guillaume Docquier, Liège (BE); Ahmed Gontara, Etterbeek (BE)

(73) Assignee: PROTON WORLD INTERNATIONAL N.V., Diegem (BE)

( * ) Notice: Subject to any disclaimer, the term of this patent is extended or adjusted under 35 U.S.C. 154(b) by 31 days.

(21) Appl. No.: 15/667,464

(22) Filed: Aug. 2, 2017

(65) Prior Publication Data

US 2018/0198464 A1  Jul. 12, 2018

(30) Foreign Application Priority Data

Jan. 12, 2017  (FR) ...................... 17 50274

(51) Int. Cl.
  *H03M 13/05* (2006.01)
  *G06F 11/10* (2006.01)
  *H03M 13/00* (2006.01)

(52) U.S. Cl.
  CPC ......... *H03M 13/05* (2013.01); *G06F 11/1004* (2013.01); *H03M 13/611* (2013.01)

(58) Field of Classification Search
  CPC ............... H03M 13/05; H03M 13/611; H03M 13/2906; G06F 11/1004; G06F 11/1044;
  (Continued)

(56) References Cited

U.S. PATENT DOCUMENTS

2006/0095659 A1* 5/2006 New ...................... G06F 3/0614
  711/112
2006/0294339 A1* 12/2006 Trika .................... G06F 11/073
  711/202

(Continued)

FOREIGN PATENT DOCUMENTS

FR  2 810 152 A1  12/2001
WO  92/21086 A1  11/1992

OTHER PUBLICATIONS

Lee et al., PCRAM assisted ECC management for enhanced data reliability in Flash storage Systems, IEEE, pp. 849-856. (Year: 2012).*

(Continued)

*Primary Examiner* — Shelly A Chase
(74) *Attorney, Agent, or Firm* — Seed IP Law Group LLP

(57) ABSTRACT

A method includes storing data and metadata related to the data in logical words in a non-volatile memory. For each logical word stored in the non-volatile memory, a corresponding error-correction code is generated. Each physical word stored contains a logical word and the corresponding error-correction code. The metadata may contain atomicity information. The non-volatile memory may be a flash memory. Each physical word may contain a parity bit based on the logical word and the corresponding error-correction code stored in the physical word. The logical words may be encoded into physical words including the corresponding error correction code using an encoding table. The data and the metadata may be split into logical words.

19 Claims, 2 Drawing Sheets

(58) Field of Classification Search
CPC .... G06F 11/1048; G06F 11/073; G06F 12/10; G06F 11/1076
See application file for complete search history.

(56) References Cited

U.S. PATENT DOCUMENTS

| | | | |
|---|---|---|---|
| 2009/0083504 A1* | 3/2009 | Belluomini | G06F 11/1076 711/162 |
| 2009/0089646 A1 | 4/2009 | Hirose et al. | |
| 2016/0110252 A1* | 4/2016 | Hyun | G11C 29/52 714/766 |
| 2017/0286311 A1* | 10/2017 | Juenemann | G06F 12/10 |

OTHER PUBLICATIONS

Memaripour et al., Atomic in-place updates for Non-volatile main memories with Kamino-Tx (retrieved from google.com) pp. 1 to 14. (Year: 2017).*
Wang et al., Persistent Transaction memory, IEEE, computer architecture letters, vol. 14, No. 1, pp. 58-61 (Year: 2015).*
Extended European Search Report, dated Sep. 22, 2017, for European Application No. 17186737.7-1954, 7 pages.
French Search Report, dated Sep. 14, 2017, for French Application No. 1750274, 7 pages.

* cited by examiner

ERROR CORRECTION IN A FLASH MEMORY

BACKGROUND

Technical Field

The present description generally relates to electronic circuits comprising a non-volatile memory and, more particularly, circuits operating a flash memory. The present description relates more particularly to the detection and correction of errors in a non-volatile memory, more particularly in a flash memory.

Description of the Related Art

Flash memories are increasingly used in microcontrollers to store information in a non-volatile manner.

The storage of data in a flash memory is subject to various time constraints linked to the granularity of the operations performed, the writing and reading being carried out per byte, whereas the erasure is carried out per page.

Furthermore, as with any memory, it must be ensured that the storage is reliable in the long term and does not become unstable. The storage must therefore be associated with error correction mechanisms.

In some applications, there is a need to ensure that the transactions performed and stored meet an atomicity criterion. The atomicity of a transaction entails ensuring that data stored in a memory in fact have an operable state. This means ensuring that data in a non-volatile memory have either the state before the transaction or the state after the transaction concerned, but do not have an intermediate state. Error correction mechanisms based on error correction codes must therefore meet the atomicity criterion. Furthermore, the different metadata enabling atomicity management must also be covered by the error correction mechanism.

BRIEF SUMMARY

One embodiment provides a method for storing data and metadata in a non-volatile memory in which each physical word of the non-volatile memory contains a logical word and an error-correcting code.

According to one embodiment, the metadata contain atomicity information.

According to one embodiment, the number of bits of a physical word corresponds to the minimum granularity for writing to the memory.

According to one embodiment, the error-correcting code is chosen to detect an inversion of one bit per byte.

According to one embodiment, the error-correcting code is a Hamming code.

According to one embodiment, the memory is a flash memory.

According to one embodiment, each physical word furthermore contains a parity bit calculated for the logical word and its error-correcting code.

One embodiment provides a flash memory, programmed according to the described method.

One embodiment provides an electronic circuit comprising a flash memory.

In an embodiment, a method, comprises: storing data and metadata related to the data in logical words in a non-volatile memory; and generating, for each logical word stored in the non-volatile memory, a corresponding error-correction code, wherein each physical word stored in the non-volatile memory contains a logical word and the corresponding error-correction code. In an embodiment, the metadata contains atomicity information. In an embodiment, a number of bits of a physical word corresponds to a minimum writing granularity of the memory. In an embodiment, the error-correction code detects an inversion of one bit per byte. In an embodiment, the error-correction code is a Hamming code. In an embodiment, the non-volatile memory is a flash memory. In an embodiment, each physical word contains a parity bit based on the logical word and the corresponding error-correction code stored in the physical word. In an embodiment, the generating the corresponding error code comprises encoding the logical word using an encoding table. In an embodiment, the method comprises splitting the data and the metadata into logical words.

In an embodiment, a flash memory comprises: a memory array; and control circuitry, which, in operation, controls storage of data and metadata related to the data in physical words of the memory array, wherein a physical word stored in the memory array includes a logical word of the data or of the metadata and an error-correction code corresponding to the logical word. In an embodiment, the metadata contains atomicity information. In an embodiment, a number of bits of a physical word corresponds to a minimum writing granularity of the flash memory. In an embodiment, the error-correction code detects an inversion of one bit per byte. In an embodiment, the error-correction code is a Hamming code. In an embodiment, each physical word stored in the memory array contains a parity bit based on the logical word and the corresponding error-correction code of the physical word. In an embodiment, a physical word is generated by encoding a logical word using an encoding table. In an embodiment, the data and the metadata are split into logical words.

In an embodiment, a system comprises: processing circuitry; and a non-volatile memory array coupled to the processing circuitry, wherein the processing circuitry, in operation, controls storing of data and metadata related to the data in logical words of the memory array, the storing of a logical word including generating an error-correction code corresponding to the logical word and generating a physical word including the logical word and the corresponding error-correction code. In an embodiment, the metadata contains atomicity information. In an embodiment, the error-correction code is a Hamming code. In an embodiment, the generating an error-correction code corresponding to the logical word and generating a physical word including the logical word and the corresponding error-correction code comprises encoding the logical word using an encoding table. In an embodiment, the memory array includes control circuitry, which, in operation, controls storage of physical words in the memory array.

In an embodiment, a non-transitory computer-readable medium's contents cause a computing system including a non-volatile memory to perform a method, the method comprising: storing data in logical words of the non-volatile memory; and storing metadata related to the data in logical words of the non-volatile memory, wherein the storing of a logical word includes generating an error-correction code corresponding to the logical word and storing a physical word in the non-volatile memory including the logical word and the corresponding error-correction code. In an embodiment, the metadata contains atomicity information. In an embodiment, the error-correction code is a Hamming code. In an embodiment, the generating an error-correction code corresponding to the logical word and storing a physical word in the non-volatile memory including the logical word and the corresponding error-correction code comprises encoding the logical word using an encoding table.

BRIEF DESCRIPTION OF THE DRAWINGS

These characteristics and advantages, along with others, will be explained in detail in the following description of particular embodiments, given in a non-limiting manner in relation to the attached figures, wherein.

DETAILED DESCRIPTION

The same elements have been denoted by the same references in the different figures.

In the interests of clarity, only the steps and elements relevant to the understanding of the embodiments that will be described have been shown and will be detailed. In particular, the electrical operation of a flash memory during the writing, reading and erasure steps has not been detailed, the embodiments described being compatible with conventional flash memory technologies. Furthermore, applications using an atomicity management have not been detailed either, the embodiments described again being compatible with conventional applications.

In the description that follows, when reference is made to the terms "approximately", "around" and "in the region of", this means to within 10%, or to within 5%.

Figure 1:
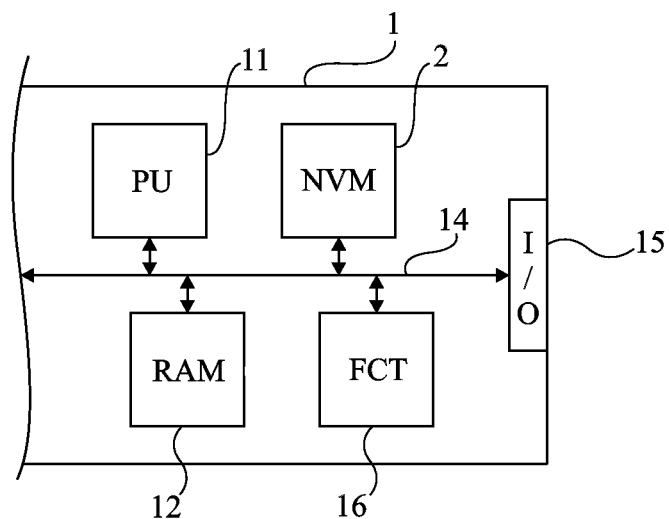
FIG. 1 is a block diagram of an example of an electronic circuit of the type to which the embodiments that will be described apply.

FIG. 1 shows, highly schematically and in the form of blocks, an embodiment of an electronic circuit 1 of the type to which the embodiments that will be described apply, by way of example.

The circuit 1 comprises:

a processing unit 11 (PU), for example a state machine, a microprocessor, a programmable logic circuit, etc.;

one or more volatile storage areas 12 (RAM), for example RAM memories or registers, to store information (instructions, addresses, data) temporarily during the processing operations;

one or more non-volatile storage areas (NVM), for example a flash memory 2 to store information in a permanent manner and, in particular, when the circuit is not powered;

one or more data, address and/or control buses 14 between the different elements within the circuit 1; and an input/output interface 15 (I/O), for example a serial bus, for communication with the outside of the circuit 1.

The circuit 1 may furthermore integrate other functions, symbolized by a block 16 (FCT), according to the application, for example a cryptoprocessor, other interfaces such as, for example, for contactless Near Field Communication (NFC), other memories, etc.

The error correction must be fast, particularly in contactless applications where transactions must be performed very quickly due to the ephemeral nature of the communication which is linked to the time period during which the circuit 1 can communicate with a terminal.

Error correction in a flash memory normally uses hardware solutions according to which the data bits that are read are combined by applying an error-correcting code, the result of which is compared with a control value stored during the reading of the corresponding datum. These hardware solutions must be provided during production. This means that they generally are not adaptable, particularly in the event of changes in the error correction requirements specification (the minimum number of bit changes per word which must be detected).

The described embodiments thus propose a software solution, e.g., based on a program executed by a processing unit.

The storage of data in a flash memory is subject to various constraints linked to the granularity of the operations performed, the reading and writing being carried out per word (for example of one or more bytes), whereas the erasure is carried out per page.

The implementation of a type of redundancy, e.g., duplication of the data storage, could be considered. However, this would only detect the presence of an error (if the two read data words are different), but would not determine which word is the correct one. Even by providing a triple storage to perform a majority decision between the three words, this would not suffice for some requirements specifications. In particular, in some applications, it is desirable to be able to correct errors that are likely to occur in all the words of the memory, for example a change of state of one bit per word. Even a triplication (or more) of the storage would not achieve this objective. Moreover, this triples the necessary memory size.

Furthermore, storage redundancy would not enable simple atomicity management, since this multiplies the number of words to be monitored.

The atomic nature of the transactions is particularly important in the case of banking transactions (payment, for example) where it is necessary to ensure that the information stored in the flash memory, for example the balance of an electronic wallet or a purchase authorization, or the identifier validating a transaction, is stored in a reliable manner.

According to an embodiment, it is provided to divide each word of the memory, e.g., each entity representing the programming granularity in write mode, into a part containing the data and a part containing an error-correcting code for the data of the first part. This therefore entails reducing the size of the (logical) data words at the time of storage in order to be able to add the error-correcting code to them in order to create the physical word to be stored in the memory. These operations can be performed through software.

The data may consist of data per se or metadata, e.g., information relating to the organization of the storage, in particular in order to manage the erasures per page and the atomicity. From the point of view of error correction, the data are processed in the same way, regardless of whether they are metadata or not.

The example of 8-bit words will be examined below, e.g., of a flash memory, the write granularity of which is the byte. However, the whole description applies more generally to any word size with a different distribution between data bits and error-correcting code bits according to the error-correcting code that is used.

Figure 2:
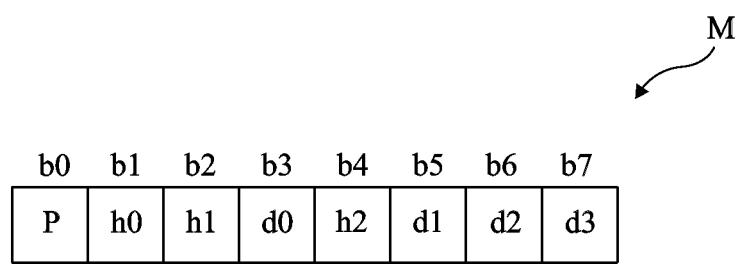
FIG. 2 is a block diagram illustrating a method for organizing a byte of a flash memory.

FIG. 2 is a block diagram illustrating a physical word M of the flash memory 2 shown in FIG. 1 in three regions.

Four bits contain data bits, e.g., the logical word. Three bits contain an error-correcting code of the logical word. One optional bit contains a parity bit of the other seven bits.

The error-correcting code is, for example, a 7/4 Hamming code. In this case:

the bits b3, b5, b6 and b7 contain the bits of the logical word, e.g., the four data bits d0, d1, d2 and d3; and the bits b1, b2 and b4 contain the three bits h0, h1 and h2 of the error-correcting code.

In the example shown in FIG. 2, the bit b0 contains a parity bit P of the other seven bits of the physical word.

The choice of error-correcting code depends on the application and, in particular, on the size of the physical word of the non-volatile memory and the number of bits required for the logical words. For example, Golay, Reed-Müller, etc. codes or 15/11 Hamming codes (for 32-bit physical words and 11-bit logical words) or 31/26 Hamming codes (for 64-bit physical words and 16-bit logical words) could be used. However, the 7/4 code offers a good compromise in terms of code size and ease of encoding and decoding with small matrices. In fact, as far as processing speed is concerned, the encoding and decoding matrices may be stored for a direct comparison (without calculation). The tables are then pre-calculated during design and are stored in a non-volatile memory and transferred to a non-volatile memory when the circuit is energized. The encoding and decoding matrices of a 7/4 Hamming code are known per se.

The choice of the size of the physical words depends on the application and the write granularity in the memory.

Figure 3:
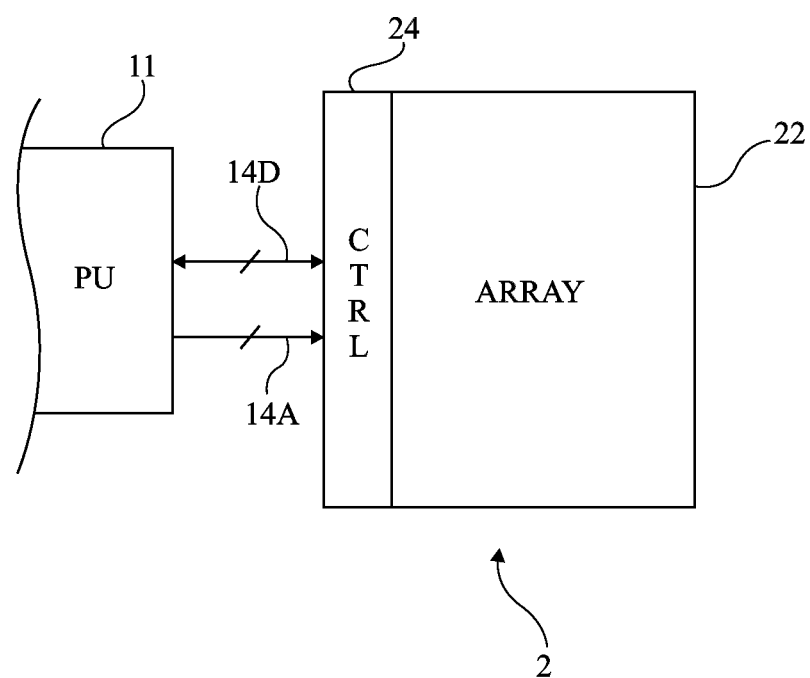
FIG. 3 illustrates, highly schematically and in the form of blocks, an embodiment of a memory.

FIG. 3 shows, highly schematically and in the form of blocks, a flash memory and partially a processing unit 11 (PU). The memory 2 comprises an array 22 (ARRAY) of memory cells and a memory controller 24 (CTRL). The controller 24 is responsible for converting logical addresses ADD supplied by the processing unit 11 or, more generally, any entity accessing the memory, on an address bus 14A, into physical addresses of memory words.

It will be noted that, as far as the memory is concerned, the word that it receives is considered to be a data word and it does not distinguish between the data bits and the error-correcting bits. It receives the address of an 8-bit word to be written and the content of this word on a data bus 14D. This represents another distinction compared with a hardware solution.

In read mode, the application of the code-decoding table corrects the error directly in the logical data word. This error is furthermore corrected, regardless of whether it is present in the data bits or in the bits of the correcting code.

In the example above of the 8-bit physical words (bytes) and 4-bit logical words, the price to be paid in terms of memory space is a doubling. However, one advantage is that the data words are processed in the same way as the metadata words. This allows this method to be applied to an endurance and/or atomicity management algorithm and the properties thereof to be preserved while making it error-resistant.

One advantage of the embodiments that have been described is that they improve the management of the errors in a non-volatile memory, such as a flash memory.

Another advantage of the embodiments described is that the error correction mechanism covers the data and metadata in the same way. Furthermore, the atomicity metadata and their respective error-correcting codes are stored in the same physical word corresponding to the granularity of the flash memory in write mode. They are therefore programmed during the same operation, thus preventing the atomicity algorithm from becoming more complex.

Miscellaneous embodiments have been described. Miscellaneous variants and modifications will be evident to the person skilled in the art. Moreover, the practical implementation of the embodiments that have been described is within the capability of the person skilled in the art on the basis of the functional indications given above and by using circuits that are conventional per se. In particular, the organization of the addressing of the memory and the generation of the signals suitable for its control and for this addressing use techniques which are conventional per se.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   storing data and metadata related to the data in logical words in a non-volatile flash memory, wherein the metadata includes transaction atomicity data; and
   generating, for each logical word stored in the non-volatile memory, a corresponding error-correction code, wherein,
   each physical word stored in the non-volatile memory contains a logical word and the corresponding error-correction code, and
   a number of bits of each physical word corresponds to a minimum writing granularity of the non-volatile memory.

2. The method according to claim 1 wherein the error-correction code detects an inversion of one bit per byte.

3. The method according to claim 1 wherein the error-correction code is a Hamming code.

4. The method according to claim 1 wherein each physical word contains a parity bit based on the logical word and the corresponding error-correction code stored in the physical word.

5. The method of claim 1, wherein the generating the corresponding error code comprises encoding the logical word using an encoding table.

6. The method of claim 1, comprising splitting the data and the metadata into logical words.

7. A flash memory, comprising:
a memory array; and
control circuitry, which, in operation, controls storage of data and metadata related to the data in physical words of the memory array, the metadata including transaction atomicity data, wherein a physical word stored in the memory array includes a logical word of the data or of the metadata and an error-correction code corresponding to the logical word, and wherein a number of bits of a physical word corresponds to a minimum writing granularity of the flash memory.

8. The flash memory of claim 7 wherein the error-correction code detects an inversion of one bit per byte.

9. The flash memory of claim 7 wherein the error-correction code is a Hamming code.

10. The flash memory of claim 7 wherein each physical word stored in the memory array contains a parity bit based on the logical word and the corresponding error-correction code of the physical word.

11. A memory device, comprising:
a memory array; and
control circuitry, which, in operation, controls storage of data and metadata related to the data in physical words of the memory array, wherein the metadata includes transaction atomicity data, wherein a physical word stored in the memory array includes a logical word of the data or of the metadata and an error-correction code corresponding to the logical word, and wherein a physical word is generated by encoding a logical word using an encoding table.

12. A memory device, comprising:
a memory array; and
control circuitry that, in operation, controls storage of data and metadata related to the data in physical words of the memory array, wherein the metadata includes transaction atomicity data, wherein a physical word stored in the memory array includes a logical word of the data or of the metadata and an error-correction code corresponding to the logical word, and wherein the data and the metadata are split into logical words.

13. A system, comprising:
processing circuitry; and
a non-volatile flash memory array coupled to the processing circuitry, wherein the processing circuitry, in operation, controls storing of data and metadata related to the data in logical words of the memory array, the metadata including transaction atomicity data, wherein the storing of a logical word includes generating an error-correction code corresponding to the logical word and generating a physical word that includes the logical word and the corresponding error-correction code, and wherein a number of bits of a physical word corresponds to a minimum writing granularity of the memory array.

14. The system of claim 13 wherein the error-correction code is a Hamming code.

15. The system of claim 13 wherein the generating an error-correction code corresponding to the logical word and generating a physical word including the logical word and the corresponding error-correction code comprises encoding the logical word using an encoding table.

16. The system of claim 13 wherein the memory array includes control circuitry, which, in operation, controls storage of physical words in the memory array.

17. A non-transitory computer-readable medium having contents which cause a computing system including a non-volatile flash memory to perform a method, the method comprising:
storing data in logical words of the non-volatile memory; and
storing metadata related to the data in logical words of the non-volatile memory, the metadata including transaction atomicity data, wherein the storing of a logical word includes generating an error-correction code corresponding to the logical word and storing in the non-volatile memory a physical word that includes the logical word and the corresponding error-correction code, and wherein a number of bits of the physical word corresponds to a minimum writing granularity of the non-volatile memory.

18. The non-transitory computer-readable medium of claim 17 wherein the error-correction code is a Hamming code.

19. The non-transitory computer-readable medium of claim 17 wherein the generating an error-correction code corresponding to the logical word and storing a physical word in the non-volatile memory including the logical word and the corresponding error-correction code comprises encoding the logical word using an encoding table.

* * * * *